(12) United States Patent
Foxall (10) Patent No.: US 6,492,811 B1
(45) Date of Patent: Dec. 10, 2002

(54) MULTISHOT ECHO PLANAR IMAGING FLUOROSCOPIC TECHNIQUE

(75) Inventor: David L. Foxall, Mentor, OH (US)

(73) Assignee: Koninklijke Philips Electronics N.V., Eindhoven (NL)

(*) Notice: Subject to any disclaimer, the term of this patent is extended or adjusted under 35 U.S.C. 154(b) by 9 days.

(21) Appl. No.: 09/718,731

(22) Filed: Nov. 22, 2000

(51) Int. Cl.$^7$ .................................................. G01V 3/00
(52) U.S. Cl. ........................................ 324/309; 324/307
(58) Field of Search .............................. 324/300, 306, 324/312, 314, 307, 309

(56) References Cited

U.S. PATENT DOCUMENTS

| | | | |
|---|---|---|---|
| 4,780,675 A | 10/1988 | DeMeester et al. | 324/312 |
| 5,229,717 A | * 7/1993 | Hinks | 324/309 |
| 5,722,409 A | * 3/1998 | Kuhara et al. | 128/653.2 |
| 6,075,362 A | * 6/2000 | Loncar et al. | 324/309 |

OTHER PUBLICATIONS

S. B. Reeder, et al., "Multi–Echo Segmented k–space Imaging: An Optimized Hybrid Sequence for Ultrafast Cardiac Imaging," *Magnetic Resonance in Medicine*, 41:375–385, 1999.
D. A. Feinberg, et al., "Echo–Planar Imaging with Asymmetric Gradient Modulation and Inner–Volume Excitation," *Magnetic Resonance in Medicine*, 13:162–169, 1990.
F. Hennel, et al., "Interleaved Asymmetric Echo–Planar Imaging," *Magnetic Resonance in Medicine*, 34:520–524, 1995.
R. Turner, "Echo–Planar Imaging of Diffusion and Perfusion," *Magnetic Resonance in Medicine*, 19:247–253, 1991.
R. Turner, et al., "Single–Shot Localized Echo–Planar Imaging," *Magnetic Resonance in Medicine*, 14:401–408 (1990).
G. C. McKinnon, "Ultrafast Interleaved Gradient–Echo–Planar Imaging on a Standard Scanner," *Magnetic Resonance in Medicine*, 30:609–616 (1993).
H. Bruder, et al., "Image Reconstruction for Echo Planar Imaging with Nonequidistant k–Space Sampling," *Magnetic Resonance in Medicine*, 23:311–323 (1992).
M. H. Buonocore, et al., "High Spatial Resolution EPI Using an Odd Number of Interleaves," *Magnetic Resonance in Medicine*, 41:1199–1205, 1999.
R. J. Ordidge, et al., "Snapshot Imaging at 0.5 T Using Echo–Planar Techniques," *Magnetic Resonance in Medicine*, 10:227–240 (1989).

(List continued on next page.)

Primary Examiner—Louis Arana
(74) Attorney, Agent, or Firm—Fay, Sharpe, Fagan, Minnich & McKee, LLP (57) ABSTRACT

A method of imaging a subject with an MRI scanner (10) includes positioning a region of interest of the subject in the MRI scanner (10) and executing an echo planar imaging pulse sequence therewith. A signal (S) produced by the echo planar imaging pulse sequence is received. The signal (S) includes first and second distinct sets of echos. Each echo (114$a$) in the first set of echos coincides with a positive polarity read gradient (112$a$) of the echo planar imaging pulse sequence and each echo (114$b$) in the second set of echos coincides with a negative polarity read gradient (112$b$) of the echo planar imaging pulse sequence. The method further includes collecting into a first k-space matrix data corresponding to the first set of echos and collecting into a second k-space matrix data corresponding to the second set of echos. A first image of the region of interest is reconstructed from the data in the first k-space matrix, and a second image of the region of interest is reconstructed from the data in the second k-space matrix. Preferably, the two images are temporally offset from one another, and cine or fluoroscopic imaging is achieved by alternating the frames thereof between iteratively produced first and second images.

17 Claims, 3 Drawing Sheets

OTHER PUBLICATIONS

K. Butts, et al., "Interleaved Echo Planar Imaging on a Standard MRI System," *Magnetic Resonance in Medicine*, 31:67–72 (1994).

D. Foxall, et al., "Rapid Iterative Reconstruction for Echo Planar Imaging," *Magnetic Resonance in Medicine*, 42:541–547 (1999).

Yang, et al., "Double–Sampled Echo–Planar Imaging at 3 Tesla", Journal of Magnetic Resonance, Series B, Academic Press, Orlando, FL v. 113, No. 2 Nov. 1, 1996 pp. 145–150 XP000633822 ISSN: 1064–1866.

Yoshitome, et al., "Half Encode and Double Shot (HEADS) EPI", Proceedings of the Int'l Society For Magnetic Resonance in Medicine, 6th Scientific Meeting &Exhibition, Sydney, Australia Apr. 18–24, 1998, v. 2, p. 1451 XP0002198014.

Posse, et al., "Enhancement of Bold–Contrast Sensitivity by Single–Shot Multi–Echo Functional MR Imaging", Mag. Res. in Medicine, Academic Press, Duluth, MN, vol. 42, No. 1, Jul. 1999 pp. 87–97 XP000845917.

* cited by examiner

MULTISHOT ECHO PLANAR IMAGING FLUOROSCOPIC TECHNIQUE

BACKGROUND OF THE INVENTION

The present invention relates to the art of diagnostic medical imaging. It finds particular application in conjunction with magnetic resonance imaging (MRI) or MRI scanners, and will be described with particular reference thereto. However, it is to be appreciated that the present invention is also amenable to other like applications.

The medical field has found MRI to be a valuable diagnostic tool for the non-invasive study or examination of a patient's anatomy. Various MRI scanners and apparatus have been describe in detail in the prior art. As is known in the art, by applying a particular combination of radio frequency (RF) pulses and magnetic gradients to a spin system set up in a region of interest, a signal therefrom (often comprising a plurality of echos) can be induced, received and processed into an image representation of the region of interest. The combination of RF pulses and magnetic gradients is commonly referred to as the pulse sequence. Again, various well known pulse sequences have been developed to address specific imaging needs.

Generally, in MRI, a substantially uniform temporally constant main magnetic field, $B_0$, is set up in an examination region in which a subject being imaged or examined is placed. Nuclei in the subject have spins which in the presence of the main magnetic field produce a net magnetization. The nuclei of the spin system precess in the magnetic field at the Larmor frequency, i.e., the resonant frequency. Radio frequency (RF) magnetic fields at and/or near the resonant frequency are used to manipulate the net magnetization of the spin system. Among other things, RF magnetic fields at the resonant frequency are used to, at least partially, tip the net magnetization from alignment with the main magnetic field into a plane transverse thereto. This is known as excitation, and the excited spins produce a magnetic field, at the resonant frequency, that is in turn observed by a receiver system. Shaped RF pulses applied in conjunction with gradient magnetic fields are used to manipulate magnetization in selected regions of the subject and produce a magnetic resonance (MR) signal. The resultant MR signal may be further manipulated through additional RF and/or gradient field manipulations to produce a series of echos (i.e., an echo train) as the signal decays. The various echos making up the MRI signal are typically encoded via magnetic gradients set up in the main magnetic field. The raw data from the MRI scanner is collected into a matrix commonly known as k-space. Typically, each echo is sampled a plurality of times to generate a data line or row of data points in k-space. The echo or data line's position in k-space (i.e., its relative k-space row) is typically determined by its gradient encoding. Ultimately, in an imaging experiment, by employing Inverse Fourier or other known transformations, an image representation of the subject is reconstructed from the k-space (or reciprocal space) data.

One well established pulse sequence and MRI technique is echo planar imaging (EPI). EPI is a general method of imaging which can be performed with, what is known as, either spin-echo, field-echo or stimulated-echo contrast. EPI is well suited to rapid imaging applications, e.g., real-time cardiac cine imaging, cardiac first pass perfusion imaging, and general interactive scanning procedures.

The speed of the EPI technique can be attributed to the fact that the signal is refocused into multiple echos by rapid reversals of the polarity of the read gradient. Typically, phase encoding of these echos forms data lines in the k-space of a final image. A data set is often built up using only a small number of excitations, or shots. In extreme cases, an image is obtained in a single shot. Given favorable system capabilities, multi-shot images can be generated in times as short as 50 to 100 ms. That equates to a rate of about 10 to 20 images per second, i.e., video rate image acquisition.

However, EPI does have certain disadvantages. For example, EPI is sensitive to field distortion and phase ghosting artifacts. Field distortion artifacts are caused by the low bandwidth per pixel employed in the phase encoding direction, while ghosting artifacts are caused by combining time reversed copies of data lines obtained under negative read gradient lobes with non-reversed data lines obtained under positive read gradient lobes. Small differences in the refocusing of the two types of data lines caused by hardware imperfections and spin evolution during the echo train are often the main sources of ghosting artifacts.

Interleaving the data lines from a small number of excitations is known to be effective at reducing the sensitivity to field distortion artifacts for only a small cost in data collection efficiency. Interleaving, however, does not solve the problem of ghosting. Ghosting is often addressed by using correction scans, sliding window acquisition or corrective reconstruction procedures that compensate for intrinsic differences between the signals generated in the echo train.

The present invention contemplates a new and improved EPI fluoroscopic technique which overcomes the above-referenced problems and others.

SUMMARY OF THE INVENTION

In accordance with one aspect of the present invention, a method of imaging a subject with an MRI scanner is provided. The method includes positioning a region of interest of the subject in the MRI scanner and executing an echo planar imaging pulse sequence therewith. A signal produced by the echo planar imaging pulse sequence is received. The signal includes first and second distinct sets of echos. Each echo in the first set of echos coincides with a positive polarity read gradient of the echo planar imaging pulse sequence and each echo in the second set of echos coincides with a negative polarity read gradient of the echo planar imaging pulse sequence. The method further includes collecting into a first k-space matrix data corresponding to the first set of echos and collecting into a second k-space matrix data corresponding to the second set of echos. A first image of the region of interest is reconstructed from the data in the first k-space matrix, and a second image of the region of interest is reconstructed from the data in the second k-space matrix.

In accordance with a more limited aspect of the present invention, the first and second images of the region of interest are temporally offset from one another.

In accordance with a more limited aspect of the present invention, the reconstructing steps are carried out employing a Fourier transformation.

In accordance with a more limited aspect of the present invention, the reconstructing steps are carried out employing a partial Fourier transformation.

In accordance with a more limited aspect of the present invention, the echo planar imaging pulse sequence is a multi-shot sequence including a plurality of excitations.

In accordance with a more limited aspect of the present invention, the first and second k-space matrices each include a plurality of interleaves which are successively filled with data.

In accordance with a more limited aspect of the present invention, the steps are iteratively carried out to achieve cine or fluoroscopic imaging of the region of interest.

In accordance with another aspect of the present invention, a magnetic resonance imaging apparatus includes an MRI scanner in which a region of interest of a patient is positioned. The MRI scanner is operable to carry out an echo planar imaging pulse sequence. A receiver observes a signal produced by the echo planar imaging pulse sequence. The signal including first and second distinct sets of echos. Each echo in the first set of echos coincides with a positive polarity read gradient of the echo planar imaging pulse sequence and each echo in the second set of echos coincides with a negative polarity read gradient of the echo planar imaging pulse sequence. Included sorting means route into a first k-space matrix data corresponding to the first set of echos and route into a second k-space matrix data corresponding to the second set of echos. A reconstruction processor reconstructs a first image of the region of interest from the data in the first k-space matrix and reconstructs a second image of the region of interest from the data in the second k-space matrix.

In accordance with a more limited aspect of the present invention, the first and second images of the region of interest are temporally offset from one another.

In accordance with a more limited aspect of the present invention, the reconstruction processor employs a Fourier transformation.

In accordance with a more limited aspect of the present invention, the reconstruction processor employs a partial Fourier transformation.

In accordance with a more limited aspect of the present invention, the echo planar imaging pulse sequence is a multi-shot sequence including a plurality of excitations.

In accordance with a more limited aspect of the present invention, the first and second k-space matrices each include a plurality of interleaves which are successively filled with data.

In accordance with a more limited aspect of the present invention, cine or fluoroscopic imaging of the region of interest is achieved via iterative operation of the magnetic resonance imaging apparatus.

In accordance with a more limited aspect of the present invention, the magnetic resonance imaging apparatus further includes a human viewable display which alternately displays the first and second images from each iteration.

In accordance with another aspect of the present invention, a method of imaging a patient with an MRI scanner includes positioning a region of interest of the patient in the MRI scanner and executing a echo planar imaging pulse sequence therewith. A signal produced by the echo planar imaging pulse sequence is received. The signal includes a plurality of echos, each of which coincides with a positive or negative polarity read gradient of the echo planar imaging pulse sequence. The method further includes sampling each echo to acquired data therefrom and sorting the acquired data into a plurality of distinct k-space matrices such that all the data in any one k-space matrix is acquired from echos coinciding with read gradients of like polarities. Finally, a plurality of distinct images of the region of interest are reconstructed from corresponding data in each of the k-space matrices. The plurality of distinct images are each temporally offset from one another.

In accordance with a more limited aspect of the present invention, the reconstructing is carried out employing a full Fourier transformation or a partial Fourier transformation.

In accordance with a more limited aspect of the present invention, the echo planar imaging pulse sequence is a multi-shot sequence including a plurality of excitations.

In accordance with a more limited aspect of the present invention, the k-space matrices each include a plurality of interleaves which are successively filled with data.

In accordance with a more limited aspect of the present invention, the steps are iteratively carried out to achieve cine or fluoroscopic imaging of the region of interest.

One advantage of the present invention is ghost reduced cine or fluoroscopic MRI imaging.

Another advantage of the present invention is data acquisition efficiency.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
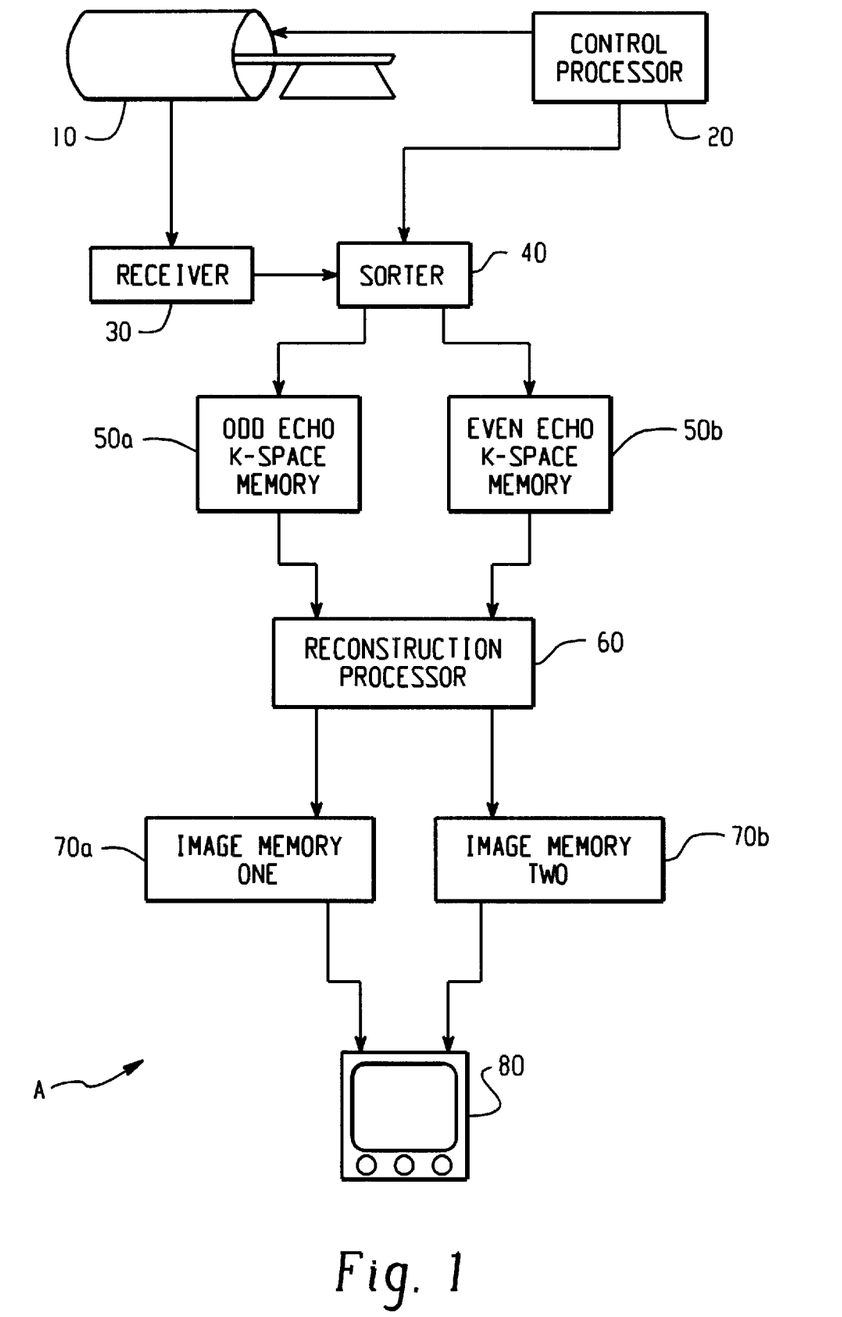
FIG. 1 is a diagrammatic illustration showing an MRI apparatus in accordance with aspects of the present invention.

With reference to FIG. 1, an exemplary medical imaging apparatus A in accordance with aspects of the present invention includes an MRI scanner 10 such as those known in the art. While the MRI scanner 10 depicted in FIG. 1 is the central bore type, alternate types of MRI scanners (e.g., so called open-magnet scanners) are equally applicable. The MRI scanner 10 comprises the usual components, namely: a main magnet, preferably superconducting, for producing the $B_0$ magnetic field; an RF coil assembly including one or more antennas for transmitting and/or receiving RF signals; a transmitter for driving the RF coil assembly; a gradient coil assembly, preferably including, three gradient coils or gradient coil sets and associated amplifiers for driving each such that magnetic gradients in the region of interest are selectively formed along three mutually orthogonal direction; etc. In any event, as is known in the art, the MRI scanner is employed to non-invasively acquire medical images or image representations of a region of interest of a patient positioned therein. optionally, the images are three-dimensional (3D) images or image representations, two-dimensional (2D) cross-sectional slices, surface renderings, or the like.

In a preferred embodiment, a control processor 20, directs the MRI scanner 10 to carry out imaging experiments in the usual manner. That is, a desired MR pulse sequence is applied via the MRI scanner 10 to achieve selected MR manipulations. The pulse sequence preferably entails a series of RF and magnetic gradient pulses that are applied to invert or excite magnetic spins, induce magnetic resonance, refocus magnetic resonance, spatially and otherwise encode the magnetic resonance, to saturate spins, and the like. A typical RF pulse is composed of a packet of immediately contiguous pulse segments of short duration which taken together with each other and any applied magnetic gradients achieve the selected MR manipulation.

In a preferred embodiment, the pulse sequence selected is an EPI sequence which induces a resulting resonance signal from the patient which is observable by a reception system. Typically, the induced signal which is observed by the reception system includes a plurality of imaging echos. In a preferred embodiment, the reception system comprises a receiver 30 (optionally digital) which receives and demodulates the signal. As is known in the art, each imaging echo of the signal is preferably sampled by the receiver 30 multiple times to generate a line or segment of raw data. In this manner, the data is acquired.

Figure 2A:
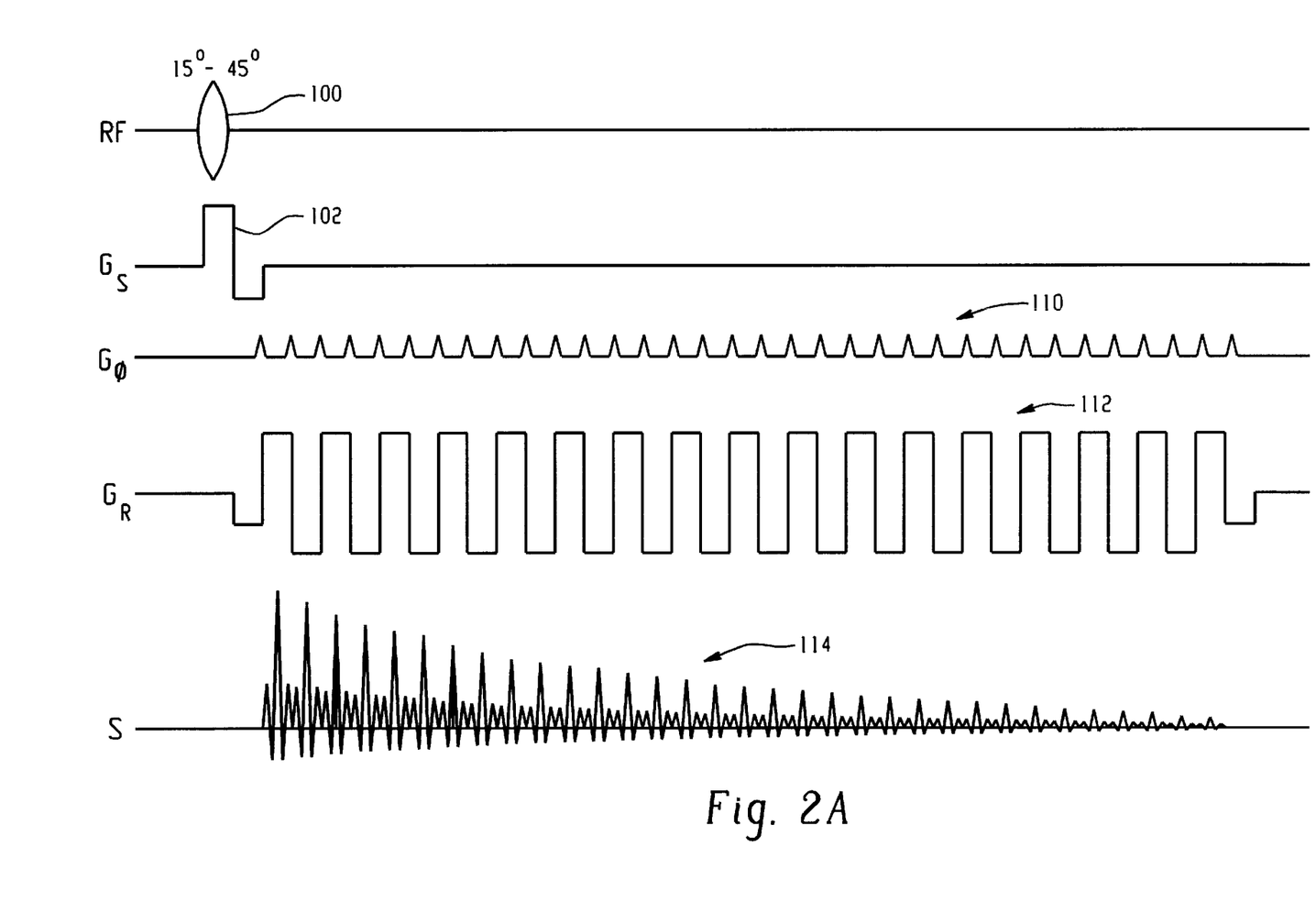
FIG. 2A is a diagrammatic illustration of an EPI pulse sequences produced in accordance with aspects of the present invention.
Figure 2B:
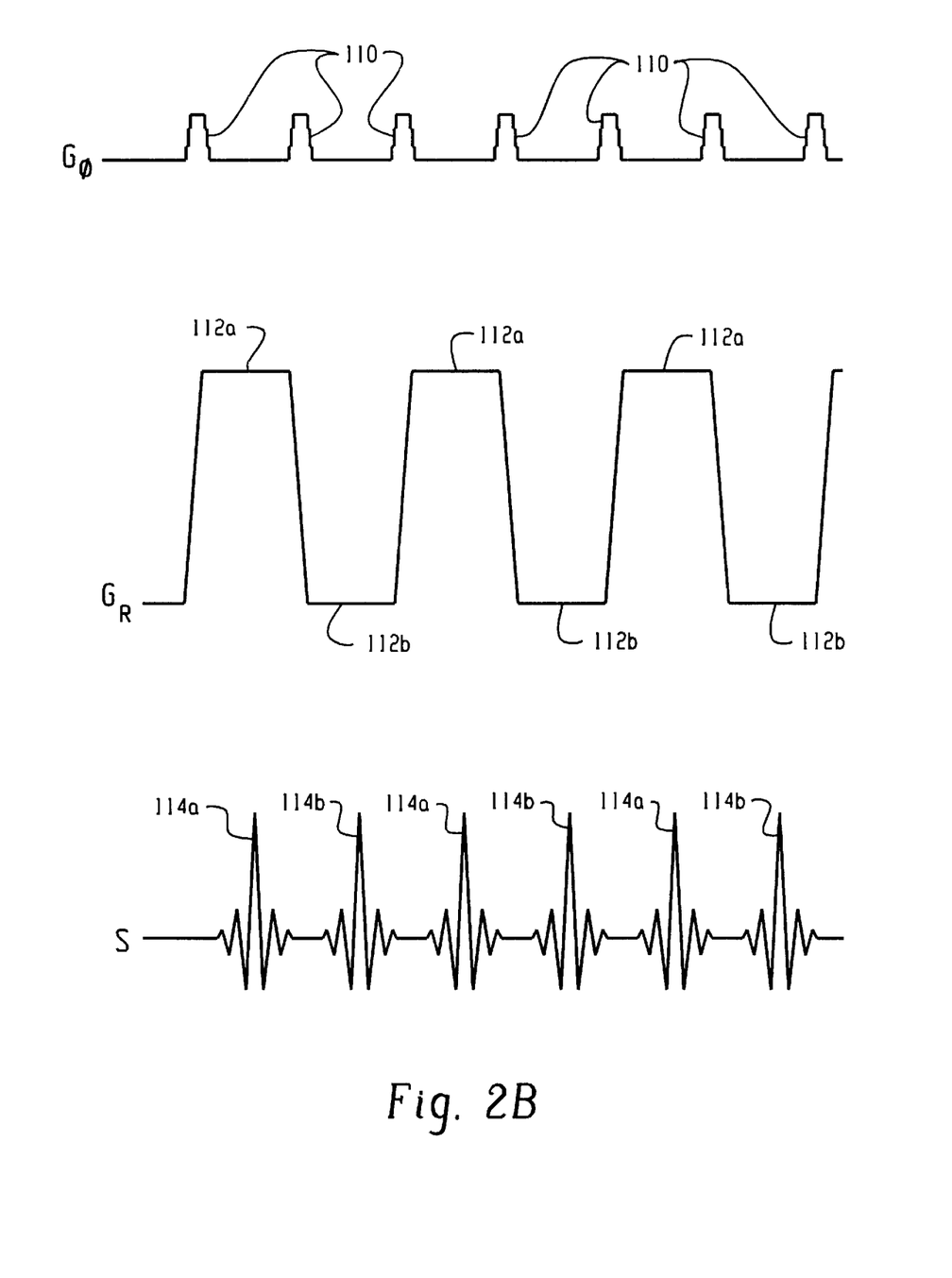
FIG. 2B is a magnified portion of the EPI pulse sequence shown in FIG. 2A.

More specifically, the MRI scan or imaging experiment is described by way of the example sequence depicted in FIGS. 2A and 2B, i.e., a timing diagram for an EPI pulse sequence. As is known in the art, the timing diagram shows the RF pulses on the RF line, the slice selection gradient pulses on the $G_S$ line, the phase encoding gradient pulses on the $G_\phi$ line, the read gradient pulses on the $G_R$ line, and the observed signal or echos on the S line. For simplicity herein, FIG. 2A shows only a single shot or excitation. Preferably, a multi-shot imaging experiment is conducted including multiple repetitions of the pulse sequence shown in FIG. 2A. The time between excitations in neighboring repetitions of a multi-shot imaging experiment is given by TR (time-to-repeat).

In a preferred embodiment, the EPI sequence is a field or gradient echo type sequence. For each shot, the EPI sequence begins with a slice selective RF excitation pulse 100 (preferably having between a 150° and 45° flip-angle) which is applied in conjunction with a slice selection magnetic gradient pulse 102. The RF pulse 100 is applied via the MRI scanner's RF coil or another specialized RF coil and the gradient pulse is applied via the MRI scanner's gradient coil assembly, preferably, in the z-direction (i.e., along the longitudinal axis of the patient). Phase encoding gradient pulses 110 and read gradient pulses 112 are also applied via the gradient coil assembly, orthogonal to one another and the gradient pulse 102, e.g., in the x- and y-directions, respectively.

The phase encoding and read gradients are cycled, for example, by applying 128 or 256 phase encoding and read gradient pulses 110 and 112, respectively, in the period when the signal 114 is recorded. With particular reference to FIG. 2B, this region of the timing diagram is examined more closely. There is shown a phase encoding gradient pulse 110, followed by a positive read gradient pulse 112a, during which time an echo 114a is recorded or sampled under a data acquisition window 120. Next, there is another phase encoding gradient pulse 110, followed by a reverse polarity or negative gradient pulse 112b, during which time the next echo 114b is recorded or sampled under the data acquisition window 120. The pattern continues until the sequence is completed, preferably, with each collected echo of the signal 114 corresponding to a horizontal data line in k-space.

For purposes of the description herein, the echos 114a collected under positive polarity read gradient pulses or lobes 112a shall be considered the "odd" echos, and the echos 114b collected under negative polarity read gradient pulses or lobes 112a shall be considered the "even " echos.

In the illustrated embodiment, under the direction of the control processor 20, a sorter 40 (optionally downstream from the receiver 30) routes the sampled data received from the receiver 30. Alternately, data routing is simply carried out by the receiver 30, optionally under the direction of the control processor 20. In any event, the raw image data corresponding to the sampled imaging echos is routed to, preferably, one of two buffers or memories 50a and 50b, where it is loaded or binned into or otherwise arranged in the matrix commonly known as k-space. Preferably, based upon the particular phase encoding imparted to each echo 114, the corresponding data line is mapped to or otherwise assigned a horizontal location in k-space. optionally, as an alternative to the memories 50a and/or 50b, other storage devices may be employed, e.g., the raw data or k-space data may be magnetically or optically stored on a disk or tape. Moreover, the memories 50a and 50b are optionally combined into a single storage device with two separate identifiable or addressable regions each comprising its own separate k-space matrix, nominally referred to hereinafter as the first and second k-spaces, respectfully.

While not shown, depending on the particular MRI scanner 10 and the particular pulse sequence and pulse shapes employed, the usual k-space data corrections and/or processing is optionally carried out at an appropriate point along the data processing stream. For example, as it is being load into the k-space memories 50a and/or 50b, the data is optionally rebinned or transformed to fit otherwise smoothly collected raw data into the rectilinear constraints of the k-space matrix or grid.

In a preferred embodiment, the sorter 40 separates the data corresponding to odd echos 114a from the data corresponding to the even echos 114b.That is, e.g., the data from all the odd echos 114a is routed to the first k-space matrix in memory 50a, while the data from all the even echos 114b is routed to the second k-space matrix in memory 50b. In this manner, data collected from echos sampled under a read gradient of a first polarity is processed apart from data collected from echos sampled under a read gradient having a second polarity different than the first. Accordingly, a potential for ghosting is eliminated which may otherwise result from the combined processing of data collected from echos sampled under read gradients of differing polarities.

Preferably after each k-space has been filled, a multi-dimensional (e.g., 2D) Inverse Fourier transform and/or other appropriate reconstruction algorithms are applied to the k-space data by a reconstruction processor 60. That is to say, the reconstruction processor 60 separately accesses the respective buffers or memories 50a and 50b and performs on the k-space data therein an Inverse Fourier transformation and/or other appropriate algorithms, as are known in the art, to reconstruct image representations of the region of interest of the patient. Alternately, k-space is only partially filled and a standard partial Fourier reconstruction employed which takes advantage of phase conjugate symmetry. See, e.g., commonly owned U.S. Pat. No. 4,780,675 to DeMeester et al., incorporated herein by reference, in its entirety. While shown in FIG. 1 as a single reconstruction processor 60, optionally, separate dedicated reconstruction processors are employed in parallel for each of the two k-space memories 50a and 50b.

The reconstructed image may represent a planar slice through the patient, an array of parallel planar slices, a 3D volume, a surface rendering or the like. The reconstructed images, corresponding to each of the first and second k-spaces, are then loaded and/or stored in image memories 70a and 70b, respectively, from which they may be selectively accessed and formatted for display on an output device, such as a video monitor 80 or other human viewable display or output device that provides a depiction of the resultant images. As with the memories 50a and 50b, other storage devices may be employed in lieu of memories 70a and 70b, e.g., the image data may be magnetically or optically stored on a disk or tape. Moreover, the memories 70a and 70b are optionally combined into a single storage device with two separate identifiable or addressable regions.

For purposes of the description herein, the images in the memories 70a and 70b are nominally referred to has the the first and second images, respectively. In a preferred embodiment, the first and second images correspond to the same region of interest. However, they are temporally offset from one another. Preferably, the temporal offset is achieved by controlling or selecting which data lines occupy the respective centers of each k-space matrix. That is, the time at which the data in the center of each k-space was acquired or generated determines, for the most part, the temporal center of each image. Accordingly, by appropriately selecting the manner or order in which each of the first and second k-space matrices is filled, the corresponding first and second reconstructed images can be made to represent the same region of interest at temporally offset moments in time. The manner or order in which each k-space filled is preferably controlled or selected by appropriate phase encoding of the data lines.

In any event, cine or fluoroscopic imaging is achieved by iterative filling the first and second k-space matrices with consecutively sampled data sets, and with each iteration, reconstructing temporally offset first and second images therefrom. Alternately, the first reconstructed image is displayed on the monitor 80, followed by the second reconstructed image, followed by the first again from the next iteration, followed by the second again from the next iteration, and so on in similar fashion. That is, the temporally offset frames of the cine or fluoroscopic image alternate between a reconstructed image originating from the odd echos 114a and a reconstructed image originating from the even echos 114b.

As one of ordinary skill in the art can appreciate, fluoroscopic imaging refers to "motion picture " type imaging where the images are obtained in real-time relative to the motion being observed. Cine imaging is different from fluoroscopic imaging. In MRI, cine imaging is typically used to capture cyclic motions where images are built up over multiple cycles by sampling in the same spots in successive cycles. The time axis for the different images is a pseudo time axis that runs over the period of the cyclic motion. Images are not obtained in "real-time." Rather, the cine method works like a stroboscope to image a motion too fast for the MRI scanner 10 to otherwise observe.

It is to be appreciated that the invention described herein is applicable to both 2D and 3D cine imaging. The 3D imaging pulse sequence is an extension of the 2D imaging pulse sequence described above. In the 3D case, however, a secondary phase encoding gradient pulse sequence is added. The secondary phase encoding is applied along the slice direction (i.e., the z-direction in the above example) to encode the selected slab into partitions.

In any event, now discussed is an exemplary k-space filling pattern in accordance with a preferred embodiment of the present invention which results in temporally offset first and second images. Filling of horizontal data lines in the first k-space begins ¼ of the way down from the top of k-space and continues to the bottom of k-space. When the bottom is reached, filling continues from the top of k-space down to the ¼ mark. As for the second k-space, filling of horizontal data lines begins ¾ of the way down from the top of k-space and continues to the bottom of k-space, at which point, filling continues from the top of k-space down to the ¾ mark. In this manner, the temporal centers of the k-space matrices and their corresponding reconstructed images are ½ TR offset from one another. Accordingly, the cine or fluoroscopic image is updated every ½ TR. Optionally, other like k-space filling schemes are employed.

Optionally, interleaving echos of similar polarity maintains data gathering efficiency, and keeps the effective bandwidth per pixel sufficiently high. In a preferred embodiment, a standard "center out " interleaving pattern of two or more interleaves is employed in each of the two k-space matrices. Optionally, other interleaving patterns are employed.

In the center out pattern, preferably, each interleave starting from the center out is filled in aforementioned manner. For example, with respect to the first k-space matrix, the center interleave is filled first ¼ of the way down from the top of the interleave and filling continues to the bottom of the interleave. The center interleave then continues to be filled from its top down to its ¼ down mark. The interleave next out is thereafter filled staring at ¼ of the way down from its top and filling of the next out interleave continues to its bottom, returning, in turn, to its top to continue filling to its ¼ down mark. Further out interleaves are, in turn, filled in similar fashion.

With respect to the second k-space matrix, the center interleave is filled first ¾ of the way down from the top of the interleave and filling continues to the bottom of the interleave. The center interleave then continues to be filled from its top down to its ¾ down mark. The interleave next out is thereafter filled staring at ¾ of the way down from its top and filling of the next out interleave continues to its bottom, returning, in turn, to its top to continue filling to its ¾ down mark. Further out interleaves are, in turn, filled in similar fashion.

Again, in this manner, the temporal centers of the k-space matrices and their corresponding reconstructed images are ½ TR offset from one another, and accordingly, the cine or fluoroscopic image is updated every ½ TR.

Of course, for partial Fourier reconstruction, the aforementioned filling of k-space and the various interleaves is altered or modified such that the appropriate portions of k-space are filled. That is, only one half of k-space may be filled and the interleaves may be a simple "stacked " pattern.

Preferably, for two frame, interleaved multi-shot cine imaging, the number of interleaves used is a multiple of four, and there are an even number of echos generated in each shot. In any event, the number of echos, the number of interleaves, the aspect ratio for the field of view and the Fourier transform size are chosen to conform with one another. Additionally, while described above with reference to two frames (i.e., one odd echo k-space corresponding to a first image, and one even echo k-space corresponding to a second image), the technique is readily extended to any number of multiple frames. In fact, a separate frame or k-space matrix could be employed for each echo generated in a given shot. Alternately, N sets of odd echos may be routed to N different k-space matrices, and N sets of even echos may be routed to still another N k-space matrices, where N is a predetermined or otherwise selected whole number. However, as echo train length increases, the cost of spreading out data acquisition over longer periods is incurred. Moreover, using later echos in the train at the center of k-space accentuates magnetic field inhomogeneities and flow artifacts. In addition, optionally limiting the technique to two images per cycle minimizes temporal blur.

As will be understood by those of ordinary skill in the art, preferably, the processors and components described herein are implemented via a software configuration, a hardware configuration, or a combination of both. Moreover, the functions of each may optionally be combined or separated as desired for efficiency or otherwise.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of imaging a subject with an MRI scanner, said method comprising:
    (a) positioning a region of interest of the subject in the MRI scanner;
    (b) executing an echo planar imaging pulse sequence with the MRI scanner;
    (c) receiving a signal produced by the echo planar imaging pulse sequence, said signal including first and second distinct sets of echos, wherein each echo in the first set of echos coincides with a positive polarity read gradient of the echo planar imaging pulse sequence and each echo in the second set of echos coincides with a negative polarity read gradient of the echo planar imaging pulse sequence;
    (d) collecting, into a first k-space matrix, data corresponding to the first set of echos;
    (e) collecting, into a second k-space matrix, data corresponding to the second set of echos;
    (f) reconstructing a first image of the region of interest from the data in the first k-space matrix;
    (g) reconstructing a second image of the region of interest from the data in the second k-space matrix, said second image being temporally offset form the first image;
    (h) displaying said first and second images one after another; and,
    (i) repeating steps (b) through (h) iteratively to achieve one of cine and fluoroscopic imaging of the region of interest.

2. The method according to claim 1, wherein the reconstructing steps are carried out employing a Fourier transformation.

3. The method according to claim 1, wherein the reconstructing steps are carried out employing a partial Fourier transformation.

4. The method according to claim 1, wherein the first and second k-space matrices each include a plurality of interleaves which are successively filled with data.

5. The method according to claim 1, wherein the first and second images are temporally offset from one another by substantially one-half of a time-to-repeat, said time-to-repeat being equal to the time between two consecutive repetitions of step (b).

6. The method according to claim 1, wherein said first and second k-space matrices each have corresponding first and second ends, the data being collected into each of the first and second k-space matrix such that:
    the first k-space matrix is filled in between the first and second ends, said filling beginning at a starting point substantially one-quarter of the way from the first end and continuing on to the second end, then continuing from the first end to the starting point; and,
    the second k-space matrix is filled in between the first and second ends, said filling beginning at a starting point substantially three-quarters of the way from the first end and continuing on to the second end, then continuing from the first end to the starting point.

7. The method according to claim 1, wherein said first and second k-space matrices each have corresponding first and second ends, the data being routed into each of the first and second k-space matrix such that:
    the first k-space matrix is filled in between the first and second ends, said filling beginning at a starting point substantially one-quarter of the way from the first end and continuing on to the second end, then continuing from the first end to the starting point; and,
    the second k-space matrix is filled in between the first and second ends, said filling beginning at a starting point substantially three-quarters of the way from the first end and continuing on to the second end, then continuing from the first end to the starting point.

8. A magnetic resonance imaging apparatus comprising:
    an MRI scanner in which a region of interest of a patient is positioned, said MRI scanner operable to carry out an echo planar imaging pulse sequence;
    a receiver which observes a signal produced by the echo planar imaging pulse sequence, said signal including first and second distinct sets of echos, wherein each echo in the first set of echos coincides with a positive polarity read gradient of the echo planar imaging pulse sequence and each echo in the second set of echos coincides with a negative polarity read gradient of the echo planar imaging pulse sequence;
    sorting means for routing into a first k-space matrix data corresponding to the first set of echos, and routing into a second k-space matrix data corresponding to the second set of echos;
    a reconstruction processor which reconstructs a first image of the region of interest from the data in the first k-space matrix, and which reconstructs a second image of the region of interest from the data in the second k-space matrix, said first and second images being temporally offset from one another; and,
    a human viewable display which alternately displays both of the first and second images one after another to achieve one of cine and fluoroscopic imaging of the region of interest via iterative operation of the magnetic resonance imaging apparatus.

9. The magnetic resonance imaging apparatus of claim 8, wherein the reconstruction processor employs a Fourier transformation.

10. The magnetic resonance imaging apparatus of claim 8, wherein the reconstruction processor employs a partial Fourier transformation.

11. The magnetic resonance imaging apparatus of claim 8, wherein the echo planar imaging pulse sequence is a multi-shot sequence including a plurality of excitations.

12. The magnetic resonance imaging apparatus of claim 8, wherein the first and second k-space matrices each include a plurality of interleaves which are successively filled with data.

13. The magnetic resonance imaging apparatus according to claim 8, wherein the first and second images are temporally offset from one another by substantially one-half of a time-to-repeat, said time-to-repeat being equal to the time between a point in a first echo planar imaging pulse sequence to a corresponding point in a second consecutive echo planar imaging pulse sequence.

14. A method of imaging a patient with an MRI scanner, said method comprising:

(a) positioning a region of interest of the patient in the MRI scanner;

(b) executing a echo planar imaging pulse sequence with the MRI scanner;

(c) receiving a signal produced by the echo planar imaging pulse sequence, said signal including a plurality of echos, wherein each echo coincides with one of a positive and negative polarity read gradient of the echo planar imaging pulse sequence;

(d) sampling each echo to acquired data therefrom;

(e) sorting the acquired data into a plurality of distinct k-space matrices such that all the data in any one k-space matrix is acquired from echos coinciding with read gradients of like polarities;

(f) reconstructing a plurality of distinct images of the region of interest from corresponding data in each of the k-space matrices, said plurality of distinct images each being temporally offset from one another; and, (g) iteratively carrying out steps (b) through (f) to achieve one of cine and fluoroscopic imaging of the region of interest.

15. The method according to claim 14, wherein the reconstructing is carried out employing one of a full Fourier transformation and a partial Fourier transformation.

16. The method according to claim 14, wherein the echo planar imaging pulse sequence is a multi-shot sequence including a plurality of excitations.

17. The method according to claim 14, wherein the k-space matrices each include a plurality of interleaves which are successively filled with data.

* * * * *